(12) United States Patent
Wu et al.

(10) Patent No.: US 12,685,047 B2
(45) Date of Patent: Jul. 14, 2026

(54) ATMOSPHERIC PRESSURE PLASMA FOR SUBSTRATE ANNEALING

(71) Applicant: Applied Materials, Inc., Santa Clara, CA (US)

(72) Inventors: Banqiu Wu, San Jose, CA (US); Khalid Makhamreh, Los Gatos, CA (US); Eliyahu Shlomo Dagan, Sunnyvale, CA (US)

(73) Assignee: Applied Materials Inc., Santa Clara, CA (US)

( * ) Notice: Subject to any disclaimer, the term of this patent is extended or adjusted under 35 U.S.C. 154(b) by 527 days.

(21) Appl. No.: 18/131,321

(22) Filed: Apr. 5, 2023

(65) Prior Publication Data

US 2024/0339324 A1 Oct. 10, 2024

(51) Int. Cl.
H10P 30/20 (2026.01)
H10P 95/90 (2026.01)

(52) U.S. Cl.
CPC ............ H10P 30/21 (2026.01); H10P 30/204 (2026.01); H10P 95/90 (2026.01)

(58) Field of Classification Search
CPC ........................ H01L 21/26513; H01L 21/324
See application file for complete search history.

(56) References Cited

U.S. PATENT DOCUMENTS

| | | | |
|---|---|---|---|
| 2004/0107907 A1* | 6/2004 | Collins | H01J 37/32082 |
| | | | 118/723 I |
| 2010/0047997 A1* | 2/2010 | Ishizuka | H01L 21/76254 |
| | | | 257/E21.567 |
| 2013/0174898 A1 | 7/2013 | Saitoh et al. | |
| 2015/0376792 A1 | 12/2015 | Spurlin et al. | |
| 2016/0189968 A1 | 6/2016 | Nakazawa et al. | |
| 2018/0082836 A1* | 3/2018 | Yan | H01L 21/02057 |
| 2018/0114720 A1* | 4/2018 | Wang | H01L 21/02381 |
| 2022/0081300 A1 | 3/2022 | Gao et al. | |
| 2022/0326607 A1 | 10/2022 | Wu et al. | |

FOREIGN PATENT DOCUMENTS

WO WO 2007/086662 A1 8/2007

OTHER PUBLICATIONS

IP.COM search attached (Year: 2026).*
PCT International Search Report and Written Opinion for PCT/US2024/021568 dated Jul. 2, 2024.

* cited by examiner

*Primary Examiner* — Zandra V Smith
*Assistant Examiner* — Andre C Stevenson
(74) *Attorney, Agent, or Firm* — Moser Taboada

(57) ABSTRACT

Methods and apparatus for contacting a substrate with a plasma at a pressure from about 300 Torr to about 1000 Torr for a period of time sufficient to heat a top portion of the substrate having a depth of less than about 200 nm, to a temperature high enough for annealing, and the temperature of the substrate at a depth of greater than or equal to about 200 nm is less than or equal to about 450° C.

9 Claims, 6 Drawing Sheets

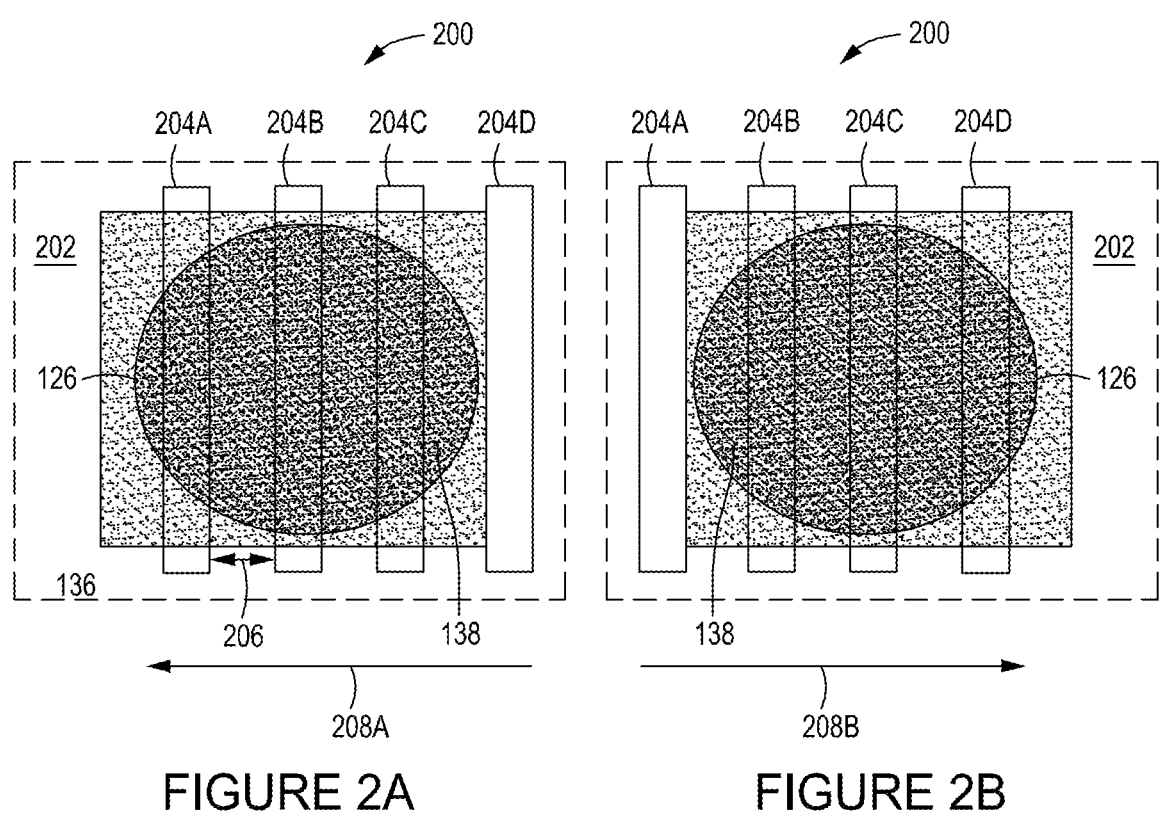
FIGURE 2A                    FIGURE 2B
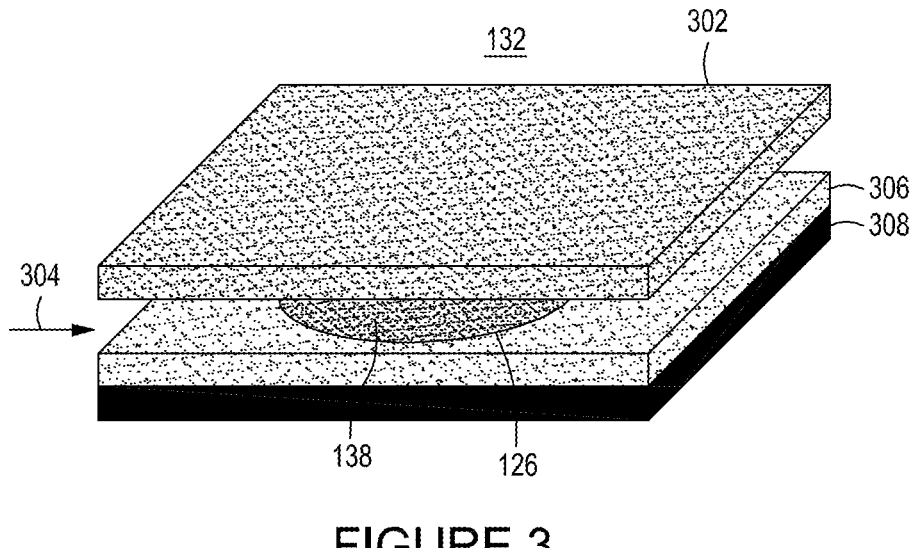
FIGURE 3

IMPLANT DAMAGE AND INACTIVE DOPANT

ANNEALED DAMAGE AND ACTIVE DOPANT

● dopant Ions

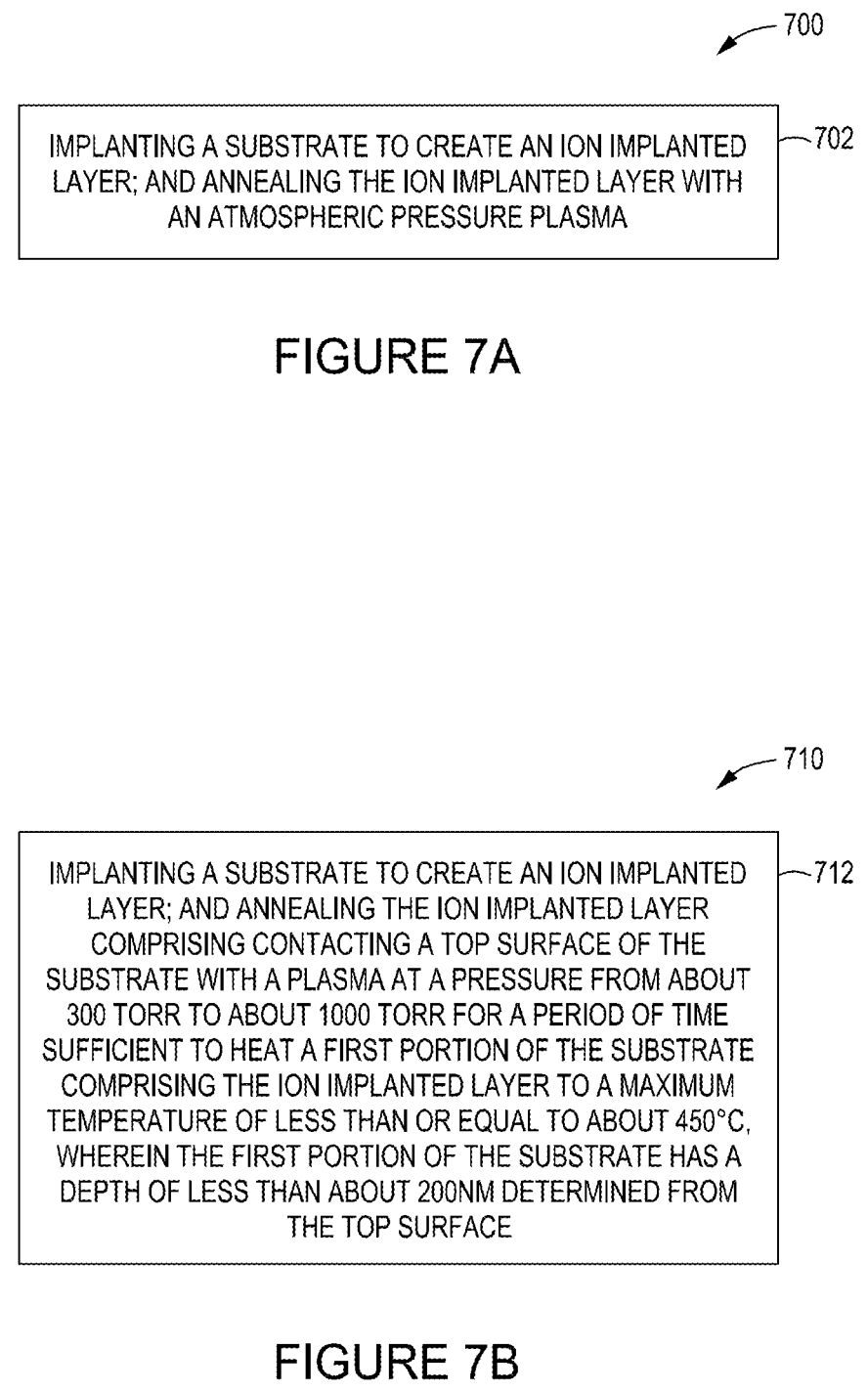

*700

IMPLANTING A SUBSTRATE TO CREATE AN ION IMPLANTED LAYER; AND ANNEALING THE ION IMPLANTED LAYER WITH AN ATMOSPHERIC PRESSURE PLASMA   *702

IMPLANTING A SUBSTRATE TO CREATE AN ION IMPLANTED LAYER; AND ANNEALING THE ION IMPLANTED LAYER COMPRISING CONTACTING A TOP SURFACE OF THE SUBSTRATE WITH A PLASMA AT A PRESSURE FROM ABOUT 300 TORR TO ABOUT 1000 TORR FOR A PERIOD OF TIME SUFFICIENT TO HEAT A FIRST PORTION OF THE SUBSTRATE COMPRISING THE ION IMPLANTED LAYER TO A MAXIMUM TEMPERATURE OF LESS THAN OR EQUAL TO ABOUT 450°C, WHEREIN THE FIRST PORTION OF THE SUBSTRATE HAS A DEPTH OF LESS THAN ABOUT 200NM DETERMINED FROM THE TOP SURFACE   *712

FIGURE 7B

ATMOSPHERIC PRESSURE PLASMA FOR SUBSTRATE ANNEALING

FIELD

Embodiments of the present principles generally relate to semiconductor manufacturing.

BACKGROUND

Computer system performance in terms of instructions per second is determined by gate delay, RC delay, and memory wall delay among other variables. The inventors have observed that interconnect and memory wall delays have a pronounced effect, compared to gate delays. Monolithic 3D IC's have the potential to solve issues related to interconnect and other delays. However, the inventors have observed that the thermal budget required by multi-layer IC thermal annealing processing poses a significant barrier to 3D IC production.

SUMMARY

Methods and apparatus for annealing of multilayer substrates are provided herein. In embodiments, a method comprises implanting a substrate to create an ion implanted layer; and annealing the ion implanted layer with an atmospheric pressure plasma.

In embodiments, a method comprises implanting a substrate to create an ion implanted layer; and annealing the ion implanted layer comprising contacting a top surface of the substrate with a plasma at a pressure from about 300 Torr to about 1000 Torr for a period of time sufficient to heat a first portion of the substrate comprising the ion implanted layer to a maximum temperature of less than or equal to about 950° C., wherein the first portion of the substrate has a depth of less than about 200 nm determined from the top surface. 0

In embodiments, a method comprises implanting a substrate to create an ion implanted layer; generating a plasma with a plasma source; and annealing the ion implanted layer comprising scanning the plasma across the ion implanted layer by moving the substrate, the plasma source, or both.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

FIG. 2A depicts contacting of a substrate with atmospheric pressure plasma which includes moving the substrate and/or the plasma source in accordance with embodiments of the present principles.

FIG. 2B depicts the contacting of a substrate with atmospheric pressure plasma which includes moving the substrate and/or the plasma source depicted in FIG. 2A.

FIG. 3 depicts contacting of an entire surface of a substrate with atmospheric pressure plasma in accordance with embodiments of the present principles.

FIG. 7A is a method of annealing a substrate in accordance with embodiments of the present principles.

FIG. 7B is a method of annealing a substrate in accordance with embodiments of the present principles.

Figure 1:
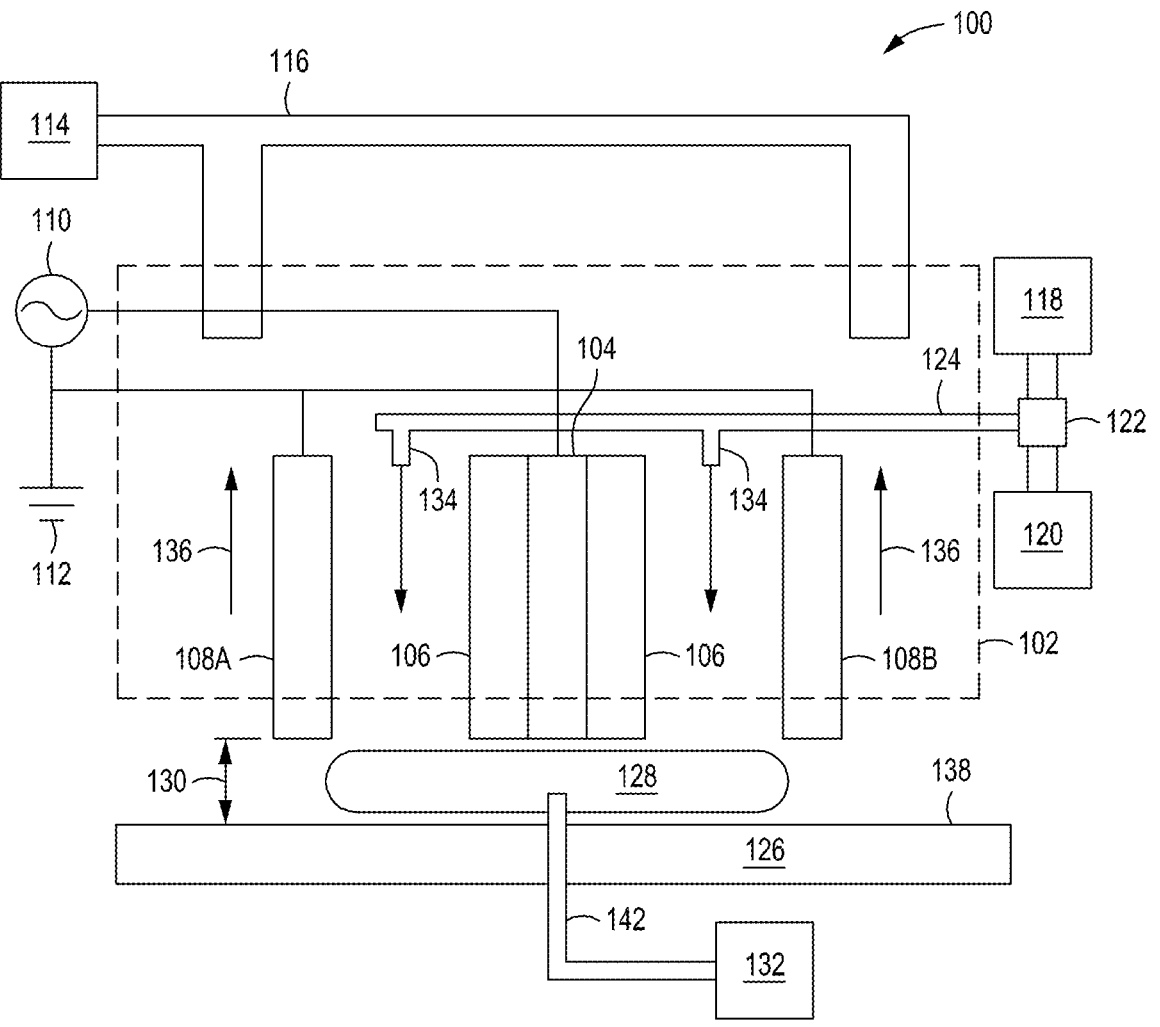
FIG. 1 depicts a cross-sectional view of an atmospheric pressure plasma reactor in accordance with embodiments of the present principles.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of a method of processing a substrate are provided herein. In particular, implanting a substrate to create an ion implanted layer; and annealing the ion implanted layer in which only an upper portion of the substrate is heated to a sufficient temperature to anneal the portion of the substrate comprising the ion implanted layer, while a second portion of the substrate below the upper portion of the substrate is not exposed to such high temperatures, which may otherwise damage the second portion of the substrate.

In embodiments, a method comprises implanting a substrate to create an ion implanted layer; and annealing the ion implanted layer with an atmospheric pressure plasma, wherein the pressure refers to the pressure of the chamber within which the substrate is contacted with the plasma. In embodiments, the atmospheric pressure plasma has a pressure from about 300 Torr to about 1000 Torr, or from about 700 Torr to about 800 Torr. In embodiments, the ion implanted layer is heated to a maximum temperature of greater than or equal to about 800° C., which in embodiments may be less than or equal to about 950° C. In embodiments, the maximum annealing temperature of the ion implanted layer is from about 850° C. to about 950° C. In embodiments, the ion implanted layer is present in a first portion of the substrate having a depth of less than about 200 nm from a top surface of the substrate. The first portion of the substrate is disposed over a second portion of the substrate, having a depth from the first portion of the substrate to a bottom surface of the substrate, (i.e., located below the first portion) which is heated during the annealing to temperature of less than the maximum temperature of the first portion. In embodiments, the ion implanted layer is present in a first portion of the substrate having a depth of less than about 200 nm from a top surface of the substrate, and the second portion of the substrate, having a depth from the first portion of the substrate to a bottom surface of the substrate, is heated to temperature of less than or equal to about 450° C.

In embodiments, the atmospheric pressure plasma has a bombardment energy of less than or equal to about 5 eV, and/is generated using RF energy at a power of less than or equal to about 1000 watts; and/or comprises helium, argon, or a combination thereof; and/or is formed via dielectric barrier discharge.

In embodiments, a method comprise implanting a substrate to create an ion implanted layer; and annealing the ion implanted layer comprising contacting a top surface of the substrate with a plasma at a pressure from about 300 Torr to about 1000 Torr for a period of time sufficient to heat a top portion of the substrate comprising the ion implanted layer, such that the second portion is heated to a maximum temperature of less than or equal to about 450° C., wherein the top portion of the substrate has a depth of less than about 200 nm determined from the top surface. In embodiments, a second portion of the substrate, having a depth of greater than about 200 nm from a top surface of the substrate to a bottom surface of the substrate, is heated to a temperature of less than or equal to about 450° C. In embodiments, the pressure is from about 700 Torr to about 800 Torr.

In embodiments, a method comprises implanting a substrate to create an ion implanted layer; and annealing the ion implanted layer comprising contacting a top surface of the substrate with a plasma produced by a plasma source at a pressure from about 300 Torr to about 1000 Torr for a period of time sufficient to heat a first portion of the substrate comprising the ion implanted layer to a maximum temperature of greater than or equal to about 800° C., wherein the first portion of the substrate has a depth of less than about 200 nm determined from the top surface; wherein a second portion of the substrate, having a depth of greater than or equal to about 200 nm, is heated to a maximum temperature of less than about 450° C.; and wherein a portion of the top surface of the substrate is contacted with the plasma while moving the substrate, the plasma source, or both. In embodiments, a relative velocity between the substrate and a plasma source is from about 3 mm/sec to about 20 mm/sec. In embodiments, a spacing between the plasma source and the top surface of the substrate is from about 0.5 mm to about 3 mm.

In embodiments, the first portion of the substrate comprises an ion implanted silicon on insulator layer and the second portion of the substrate comprises at least one annealed ion implanted silicon layer. In embodiments, the second portion of the substrate comprises an annealed ion implanted silicon on insulator layer disposed below the first portion of the substrate. In embodiments, the contacting the top surface of the substrate with the plasma comprises contacting a portion of the top surface of the substrate with the plasma while moving the substrate, a plasma source, or both. In embodiments, the contacting the top surface of the substrate with the plasma comprises contacting essentially all of the top surface of the substrate with the plasma at the same time. In embodiments, the maximum temperature of the first portion is from about 850° C. to about 950° C.

In embodiments, the plasma suitable for use according to embodiments disclosed herein is produced at a pressure from about 300 Torr to about 1000 Torr. Such plasma is referred to herein as an atmospheric pressure (AP) plasma. In embodiments, the AP plasma may be produced by an apparatus which provides a dielectric barrier discharge (DBD) plasma. The AP plasma apparatus may be ignited over an ignition plate to avoid having unstable plasma damaging the substrate. The plasma may be monitored with optical emission spectrometer (OES) sensors to ensure that the plasma is stable before the plasma is allowed to contact the upper or top surface of the substrate, which in embodiments includes moving the heads of the apparatus over the upper surface of the substrate for annealing according to embodiments disclosed herein.

In embodiments, the apparatus may include an assistant plate which surrounds the substrate to prevent unwanted arcing or discharges that would damage the substrate during annealing or other such processing.

In embodiments, the OES sensors are configured to monitor the annealing of the substrate to determine when the annealing of the substrate has been completed, e.g., annealed, allowing automatic termination of the process along with improved plasma stability and reduced arcing. In embodiments, a multiple plasma head AP plasma apparatus may be employed which scans back and forth across the upper surface of the substrate during the annealing to obtain identical plasma residence time on the upper surface of the substrate. The spacing between the plasma heads allows for overscan to permit complete coverage of the upper surface of the substrate during annealing.

In embodiments, a DBD apparatus is employed which utilizes an electrical discharge between two electrodes separated by an insulating dielectric barrier. The dielectric barrier produces a self-pulsing plasma operation and establishes a non-thermal plasma at or near atmospheric pressures, which in embodiments is from about 300 Torr to about 1000 Torr. The inventors have found that AP plasma may be used to anneal an upper portion of a substrate without heating the entire substrate to temperatures which may damage or destroy previously applied and processed layers.

In FIG. 1, a block diagram of an AP plasma system 100 is depicted which includes an AP plasma reactor 102 that produces DBD plasma in accordance with embodiments. The AP plasma reactor 102 has an RF electrode 104 that is surrounded by a dielectric layer 106 and powered by an RF power supply 110 that also interfaces with a ground 112. The RF electrode 104 generates plasma 128 to process or otherwise treat a substrate 126.

The plasma 128 is generated between the RF electrode 104 and a first ground electrode 108A and a second ground electrode 108B. The first ground electrode 108A and the second ground electrode 108B are electrically connected to the ground 112. The RF electrode 104 (with dielectric layer 106), the first ground electrode 108A, and the second ground electrode 108B form an AP plasma head. In embodiments, RF power may be supplied to the AP plasma head at less than or equal to about 1000 watts, or less than or equal to about 800 watts, or less than or equal to about 700 watts, or less than or equal to about 500 watts total power during substrate annealing.

In embodiments, the plasma is contacted with the substrate 126 at a bombardment energy of less than or equal to about 5 eV, or less than or equal to about 2 eV. In embodiments, the RF power may be supplied at a frequency of approximately 13.56 MHz and the like. During annealing of the substrate 126, a gas mixture is flowed around the outside of the dielectric layer 106 between the dielectric layer 106 and the first ground electrode 108A and the second ground electrode 108B towards the substrate 126. In embodiments, the gas mixture may be generated from a first gas supply 118 and a second gas supply 120 that is intermixed by a mixing apparatus 122 and flowed through a gas line 124 and out a plurality of nozzles 134.

In embodiments, the first gas supply 118 supplies a carrier gas such as argon gas, helium gas, or a combination thereof. In embodiments, the gas supply may include a second gas supply 120 configured to supply a reactive gas, which in embodiments may include an oxidizing agent and/or a reducing agent such that the plasma formed therefrom comprises an oxidizing agent or a reducing agent. Suitable gases include oxygen, hydrogen, ammonia, and the like. In embodiments, water vapor may also be combined with the gas mixture by the mixing apparatus 122 during annealing of the substrate 126.

A ventilation apparatus 114 uses a ducting system 116 to remove byproducts from the annealing of the substrate 126. In embodiments, the ventilation apparatus 114 may include a blower apparatus and the like. The ventilation flow 136 is to the outer side of the first ground electrode 108A and to the outer side of the second ground electrode 108B.

The plasma 128 may be monitored by an optical emissions spectrometer—OES sensor 132 via a fiber optic input 142 to determine the characteristics of the plasma 128 during ignition and also during annealing of the substrate 126. The OES sensor 132 is able to monitor the peaks of different wavelengths which relate to different gases to determine characteristics of the plasma. The plasma characteristics can be used to adjust the plasma during ignition. The plasma characteristics can also be used during annealing to determine plasma stability, improve the plasma, and/or to determine annealing endpoints wherein annealing can be automatically halted.

In embodiments, the spacing 130 between the lowermost portion of the RF electrode 104, the first ground electrode 108A, and the second ground electrode 108B to the top surface 138 of the substrate 126 may be from about 0.5 millimeters to about 5 millimeters, which in embodiments is from about 1 millimeter to about 3 millimeters.

FIG. 2A depicts a view 200 of an AP plasma reactor 202 that produces DBD plasma in accordance with embodiments. The AP plasma reactor 202 incorporates a plurality of plasma heads 204A-204D that each produce a plasma areas directly between the plasma head and the substrate 126 making up the overall plasma coverage area of the apparatus. In embodiments, the spacing between the plasma head and the upper surface of the substrate is from about 0.5 mm to about 3 mm, or from about 1 mm to about 2 mm.

The AP plasma reactor 202 may have any number of AP plasma heads. Spacing 206 between the plurality of plasma heads 204A-204D allow for ventilation of byproducts that are produced during annealing of a substrate.

As the substrate and/or the AP plasma reactor 202 may move back and forth relative to each other in a scanning fashion, the spacing 206 between the plurality of plasma heads 204A-204D is compensated for by the movement in a first direction 208A and a second direction 208B of either the plasma heads 204A-204D with respect to the substrate 126, or the substrate 126 with respect to the plasma heads 204A-204D. As depicted in FIG. 2A, the plasma heads 204A-204D may be moved laterally in a first direction 208A, and then in a second direction 208B as depicted in FIG. 2B such that the entire surface of the ion implanted substrate 126 is contacted with the plasma produced by the plasma heads 204A-204D. Accordingly, the contacting of the substrate 126 with the plasma comprises contacting a portion of the top surface of the substrate 126 with the plasma while moving the substrate 126, the plasma source e.g., plasma heads 204A-204D, or both. In embodiments, the relative velocity between the plasma head and the substrate, e.g., the scan speed, is from about 3 mm/sec to about 20 mm/sec, either from movement of the plasma heads, the substrate, or both.

FIG. 3 depicts a plasma reactor wherein the entire substrate 126 is contacted at the same time by the plasma. In an embodiment, a treatment chamber 300 may include an RF electrode 302 spaced above the substrate 126 disposed on a pedestal 306 in electrical communication with a ground 308. A gas 304 is directed between the RF electrode 302 and the substrate to form the AP plasma. Accordingly, the contacting of the substrate with the plasma may comprise contacting essentially all of the top surface of the substrate with the plasma at the same time.

In embodiments, the implanting a substrate to create an ion implanted layer may comprise a plasma assisted implantation process, beam-line ion implantation, and/or the like. The implanting of the substrate may further comprise the entire surface of the substrate may be doped or if select regions of the substrate are to be doped, a patterned mask layer, such as a patterned photoresist layer, may be deposited atop the substrate to protect regions of the substrate that are not to be doped. For example, in some embodiments, a masking layer, such as a layer of photoresist, may be provided and patterned such that the dopant region is formed only on portions of the substrate.

The one or more dopants to be implanted may comprise any suitable element or elements typically used in semiconductor doping processes. Examples of suitable dopants include one or more of group III elements or group V elements, such as, in a non-limiting example, arsenic (As), boron (B), indium (In), phosphorous (P), antimony (Sb), or the like. Examples of n-type dopants may include at least one of phosphorus, arsenic, or the like. For example arsine ($AsH_3$), di-arsenic fluoride ($As_2F_5$), phosphine ($PH_3$), or phosphorus trifluoride ($PF_3$) are typical dopant precursors used for n-type implant process targeting conformal FIN-FET (FIN Field Effect Transistors), conformal DRAM (Dynamic Random Access Memory) and conformal Flash doping applications. For p-type doping, boron-containing precursors, such as boron trifluoride ($BF_3$), diborane ($B_2H_6$), or the like, may be used. Examples of other dopants suitable for material modification of the substrate, or portions thereof, include germane ($GeH_4$), methane ($CH_4$), carbon dioxide ($CO_2$), carbon tetrafluoride ($CF_4$), silane ($SiH_4$), silicon tetrafluoride ($SiF_4$), nitrogen ($N_2$), and oxygen ($O_2$).

Figure 4A:
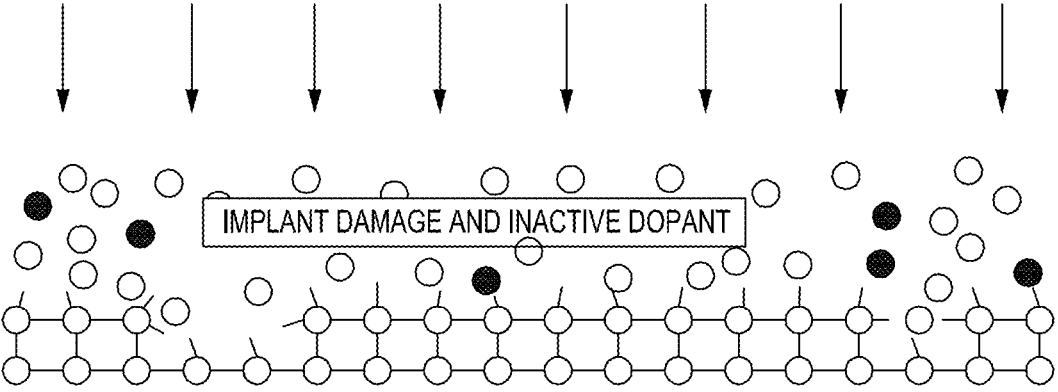
FIG. 4A depicts ion implantation of a substrate in accordance with embodiments of the present principles.
Figure 4B:
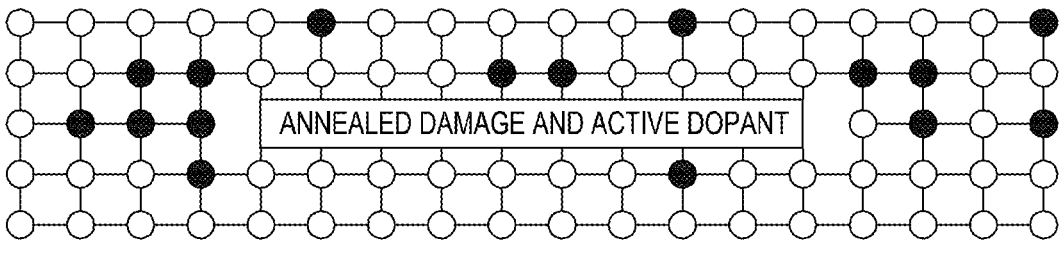
FIG. 4B depicts the ion implanted substrate depicted in FIG. 4A after annealing in accordance with embodiments of the present principles.

The ion implant process puts the dopant atoms into the silicon substrate by bombarding the silicon wafers with very energetic ions. The ion implant process inevitably results in crystal damage of the upper portion of the substrate as depicted in FIG. 4A. The implant damage can take many different forms, such as non-equilibrium excess of vacant lattice sites (vacancies) and self-interstitial atoms (interstitials), vacancy clusters, interstitial clusters, dopant-interstitial and dopant-vacancy clusters, and locally amorphized regions of the crystalline silicon target. Iso-valent ions such as Si or Ge are sometimes implanted to intentionally take advantage of the ion implant damage. Such an implanted dopant is referred to herein as an essentially inactive dopant.

To cure the above-described defects, the implanted substrate is annealed with atmospheric pressure plasma, which is formed at a pressure from about 300 Torr to about 1000 Torr, or from about 700 Torr to about 800 Torr, or at the ambient atmospheric pressure of the processing chamber, typically about 760 Torr, to form an essentially active dopant. In embodiments, the annealing comprises contacting an contacting of the substrate with a plasma at a pressure from about 300 Torr to about 1000 Torr for a period of time sufficient to heat a top portion of the substrate having a depth of less than about 200 nm, to a temperature high enough for annealing. Traditional anneal of an ion implanted silicon layer is conducted at greater than or equal to about 800° C., up to about 950° or higher. A multilayered substrate comprising one or more silicon on insulator layers (SOI) cannot be annealed at such high temperatures due to the damage of transistors and other features present in the layer beneath the SOI layer, which are located between the SOI layer and the bottom of the substrate.

However, when an ion implanted substrate is annealed according to embodiments disclosed herein, only a first portion of the substrate comprising the ion implanted layer, or consisting essentially of the ion implanted layer, or consisting of the ion implanted layer is heated to a temperature sufficient for annealing e.g., greater than or equal to about 800° C. The portion of the substrate below the first portion, referred to herein as the second portion of the substrate, is not heated to the annealing temperature, but is only heated to a lower maximum allowed temperature (e.g., 450° C.) depending on a thermal budget of the underlying substrate, allowing for the implanted silicon substrate having an essentially inactive dopant implanted SOI layer to be annealed to form a processed substrate comprising an annealed substrate having an essentially active dopant, without significantly affecting the layers below the first portion.

Figures 5A, 5B, 6A, 6B:
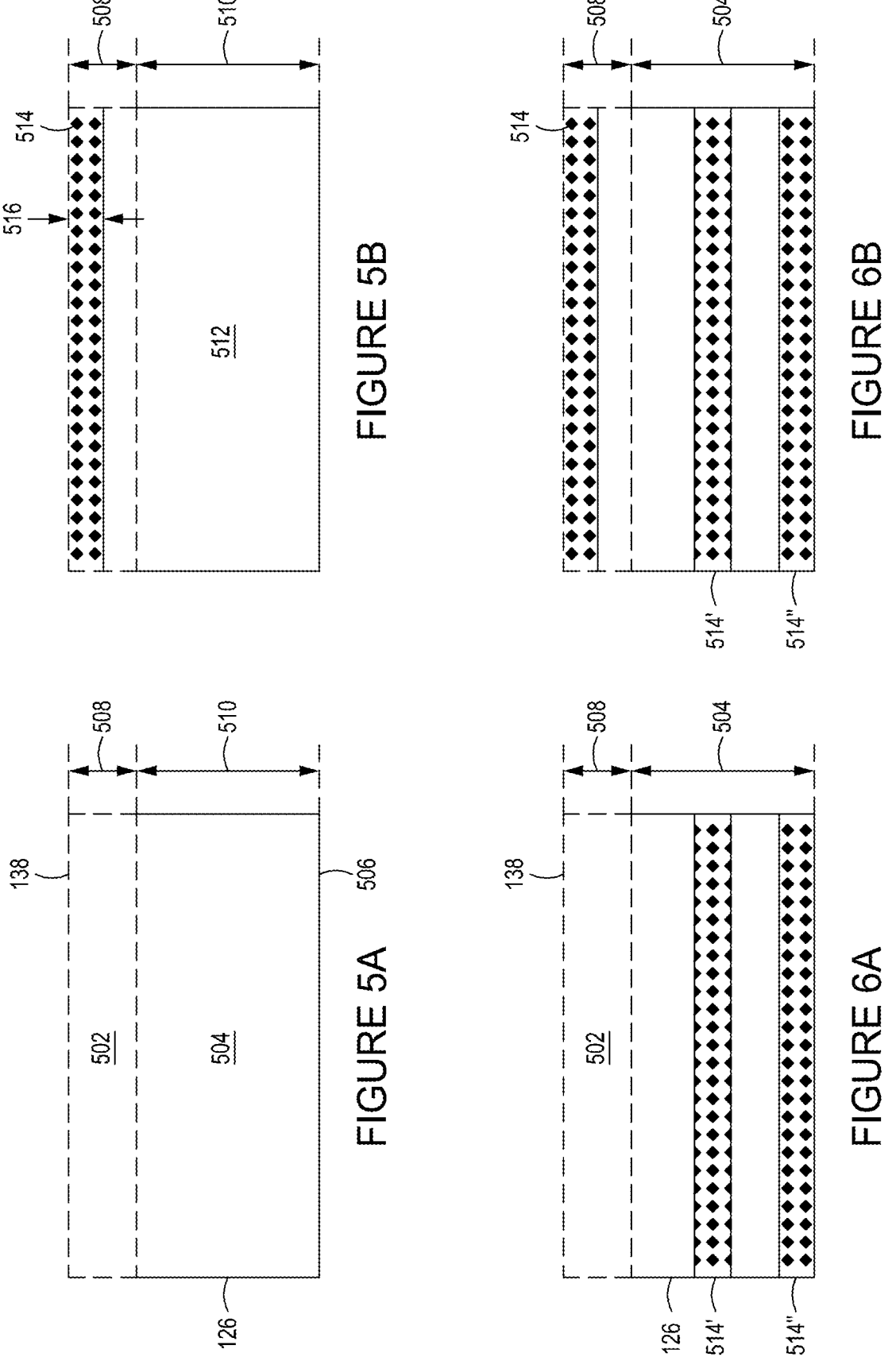
FIG. 5A depicts a substrate prior to being contacted with the atmospheric pressure plasma in accordance with embodiments of the present principles.
FIG. 5B depicts the substrate depicted in FIG. 5A after being contacted with the atmospheric pressure plasma in accordance with embodiments of the present principles.
FIG. 6A depicts a multilayer substrate prior to being contacted with the atmospheric pressure plasma in accordance with embodiments of the present principles.
FIG. 6B depicts the multiplayer substrate depicted in FIG. 6A after being contacted with the atmospheric pressure plasma in accordance with embodiments of the present principles.

FIG. 5A depicts an ion implanted substrate 126 comprising an ion implanted layer disposed within a first portion 502 located directly below the top surface 138 of the substrate 126. In embodiments, the first portion 502 has a depth 508 of less than about 200 nm from the top surface 138, which in embodiments may be greater than or equal to about 150 nm from the top surface 138 or less than about 100 nm from the top surface 138. The second portion 504 has a depth 510 which begins at the point where the first portion 502 ends; and extends to the bottom surface 506 of the substrate. In embodiments, the second portion 504 of the substrate begins at a depth from the top surface 138, of greater than or equal to about 150 nm, or greater than or equal to about 200 nm, or greater than or equal to about 250 nm, or greater than or equal to about 300 nm, or greater than or equal to about 400 nm, and less than or equal to about 500 nm from the top surface 138.

In embodiments, the annealing of the ion implanted layer includes contacting the top surface 138 of the substrate 126 with the AP plasma, which in embodiments may be at a pressure from about 300 Torr to about 1000 Torr, or at a pressure from about 700 Torr to about 800 Torr, or at atmospheric pressure, for a period of time sufficient to heat the ion implanted layer present in the first portion 502 of the substrate 126, to a temperature high enough for annealing, which in embodiments is greater than or equal to about 800° C., or from about 800° C. to about 950° C., and the second portion of the substrate, which in embodiments begins at a location from about 200 nm below the top surface 138 of the substrate 126, and which begins at a location less than or equal to about 500 nm below the top surface 138 of the substrate 126, and which then extends to the bottom of the substrate, is heated to a maximum temperature of less than or equal to about 450° C., or less than or equal to about 400° C., thereby forming an annealed substrate 512 as depicted in FIG. 5B.

As depicted in FIG. 5B, in embodiments, the annealed substrate 512 may comprise an annealed upper layer 514 with an active dopant formed from the first portion 502 of the substrate 126. In embodiments, the annealed upper layer 514 may have a depth 516 which is less than the depth 508 of the first portion 502 prior to annealing.

In embodiments, the annealing includes contacting the ion implanted layer (the substrate) with the plasma for a period of time from about 0.5 min to about 50 hours. In embodiments, the substrate is contacted with the plasma for greater than or equal to about 15 min, or greater than or equal to about 30 min, or greater than or equal to about 60 min, or greater than or equal to about 120 min, and less than or equal to about 10 hours, or less than or equal to about 4 hours.

In embodiments, the annealing time is greater than or equal to about 10 minutes, or greater than or equal to about 20 minutes, or greater than or equal to about 30 minutes, and less than or equal to about 90 min, or less than or equal to about 70 min, or less than or equal to about 60 min, or less than or equal to about 50 min.

As depicted in FIG. 6A, in embodiments, the substrate 126 comprises a first portion 502 located directly below the top surface 138 of the substrate 126, wherein the first portion 502 of the substrate 126 comprises an ion implanted silicon on insulator layer disposed over at least one other previously annealed ion implanted silicon layer 514' which may include a plurality of previously annealed ion implanted silicon layers e.g., 514' and 514" disposed below the first portion 502 of the substrate 126, which in embodiments are annealed ion implanted silicon on insulator layers disposed below the first portion of the substrate.

In embodiments, other processing other than, or in addition to annealing may be conducted on the substrate. Examples include oxidative processing of the substrate surface, wherein the substrate is contacted with a plasma comprising an oxidizing agent. Other examples include reductive processing of the substrate surface, wherein the plasma comprises a reducing agent. These processes may be conducted alone, or in combination with an annealing process of the substrate.

FIG. 7A is a flow chart of a method 700, according to embodiments disclosed herein. In embodiments, the process block of FIG. 7A may be performed by one or more processing systems.

As shown in FIG. 7A, a method 700 which includes implanting a substrate to create an ion implanted layer; and annealing the ion implanted layer with an atmospheric pressure plasma (block 702). While FIG. 7A shows a single example block of method 700, in embodiments, method 700 may include additional blocks.

FIG. 7B is a flow chart of a method 710, according to embodiments disclosed herein. In embodiments, the process block of FIG. 7B may be performed by one or more processing systems.

As shown in FIG. 7B, a method 710 which implanting a substrate to create an ion implanted layer; and annealing the ion implanted layer comprising contacting a top surface of the substrate with a plasma at a pressure from about 300 Torr to about 1000 Torr for a period of time sufficient to heat a first portion of the substrate comprising the ion implanted layer to a maximum temperature of less than or equal to about 950° C., wherein the first portion of the substrate has a depth of less than about 200 nm determined from the top surface (block 712). While FIG. 7B shows a single example block of method 710, in embodiments, method 710 may include additional blocks.

Figure 8:
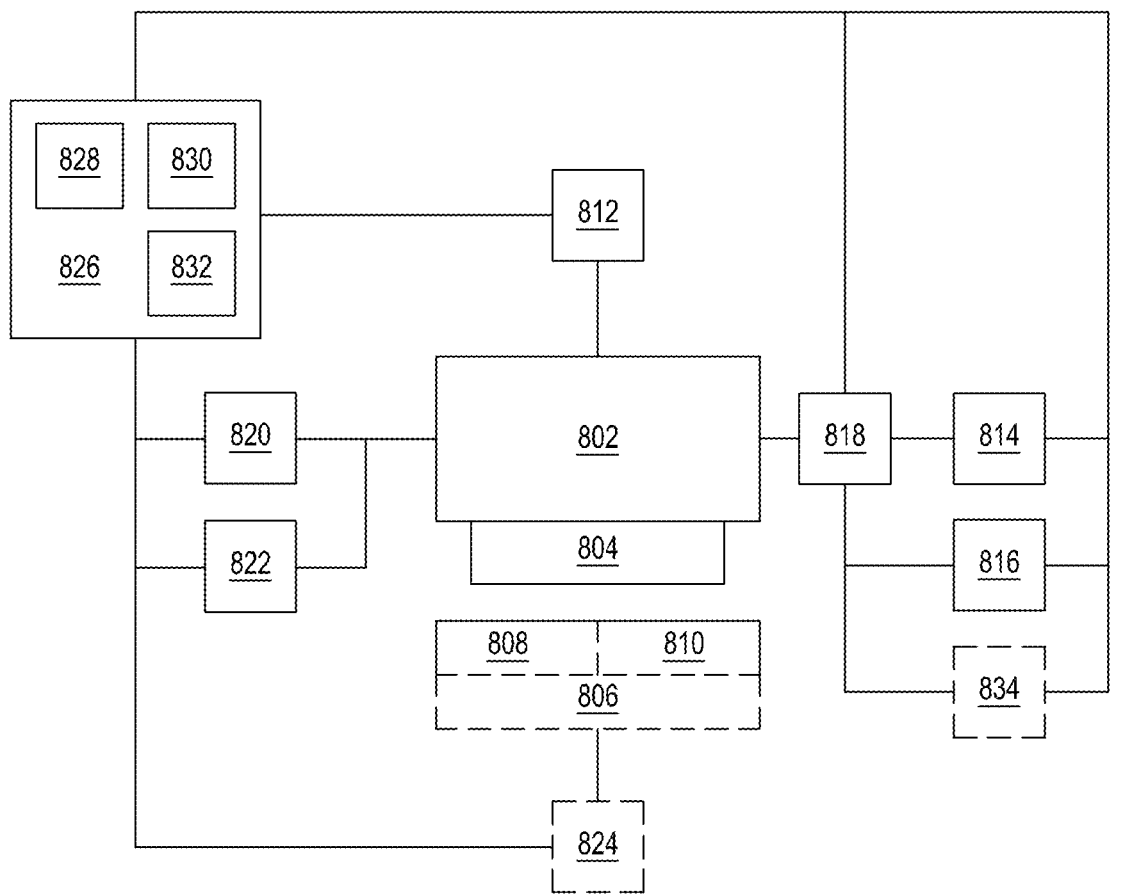
FIG. 8 depicts a block diagram of an atmospheric pressure (AP) plasma processing system in accordance with embodiments of the present principles.

FIG. 8 depicts a view of an AP plasma processing system 800 that produces DBD plasma in accordance with embodiments. The AP plasma processing system 800 includes an AP plasma reactor 802 with one or more AP plasma heads 804. The AP plasma reactor 802 is positioned above an ignition plate 808 and an assistant plate 810 that reside on an optional support pedestal 806. In embodiments, the AP plasma reactor 802 moves in relation to the ignition plate 808 and the assistant plate 810. In embodiments, the ignition plate 808 and the assistant plate 810 move in relation to the AP plasma reactor 802. An optional actuator 824 may be used to move the ignition plate 808 and the assistant plate 810 to perform ignition of the plasma over the ignition plate 808 and to scan a sample in the assistant plate 810. The optional actuator 824 may be controlled by and provide feedback to a controller 826. The AP plasma reactor 802 may interface with an RF power supply 820 to facilitate generating plasma beneath the one or more AP plasma heads 804. The RF power supply 820 and the ground electrodes of the one or more AP plasma heads 804 may also be electrically connected to a system ground.

A first gas supply 814 and a second gas supply 816 may be mixed in gas mixer 818 and flowed over the RF electrodes in the one or more AP plasma heads 804. In some embodiments, a water vapor supply 834 may also be mixed with the mixed gases and flowed over the RF electrodes in the one or more AP plasma heads 804.

A venting apparatus 822 may also be used in the AP plasma processing system 800 to remove byproducts that occur during annealing of a substrate. An OES sensor 812 may also provide plasma characterization for the AP plasma processing system 800 during ignition of the plasma and during annealing of the substrate. The controller 826 interacts with one or more of the apparatus of the AP plasma processing system 800 to automate and/or regulate processes and timing to ensure optimal performance of the AP plasma processing system 800. The controller 826 may alter power levels of the RF power supply 820, venting velocities of the venting apparatus 822, gas mixture levels of the first gas supply and the second gas supply, water vapor supply levels, and movement of the AP plasma reactor 802 and/or the ignition plate 808/assistant plate 810 based on processing recipes and/or feedback from the OES sensor 812 and the like.

The controller 826 controls the operation of the AP plasma processing system 800 using direct control or alternatively, by controlling the computers and/or controllers associated with the AP plasma processing system 800. In operation, the controller 826 enables data collection and feedback from the respective apparatus and systems to optimize performance of the AP plasma processing system 800. The controller 826 generally includes a Central Processing Unit (CPU) 828, a memory 830, and a support circuit 832. The CPU 828 may be any form of a general-purpose computer processor. The support circuit 832 is conventionally coupled to the CPU 828 and may comprise a cache, clock circuits, input/output subsystems, power supplies, and the like. Software routines, such as a method as described below may be stored in the memory 830 and, when executed by the CPU 828, transform the CPU 828 into a specific purpose computer or controller 826. The software routines may also be stored and/or executed by a second controller that is located remotely from the AP plasma processing system 800.

The memory 830 is in the form of computer-readable storage media that contains instructions, when executed by the CPU 828, to facilitate the operation of the processes and equipment. The instructions in the memory 830 are in the form of a program product such as a program that implements the methods of the present principles. The program code may conform to any one of a number of different programming languages. In one example, the disclosure may be implemented as a program product stored on a computer-readable storage media for use with a computer system. The program(s) of the program product define functions of the aspects (including the methods described herein). Illustrative computer-readable storage media include, but are not limited to: non-writable storage media (e.g., read-only memory devices within a computer such as CD-ROM disks readable by a CD-ROM drive, flash memory, ROM chips, or any type of solid-state non-volatile semiconductor memory) on which information is permanently stored; and writable storage media (e.g., floppy disks within a diskette drive or hard-disk drive or any type of solid-state random access semiconductor memory) on which alterable information is stored. Such computer-readable storage media, when carrying computer-readable instructions that direct the functions of the methods described herein, are aspects of the present principles.

Embodiments in accordance with the present principles may be implemented in hardware, firmware, software, or any combination thereof. Embodiments may also be implemented as instructions stored using one or more computer readable media, which may be read and executed by one or more processors. A computer readable medium may include any mechanism for storing or transmitting information in a form readable by a machine (e.g., a computing platform or a "virtual machine" running on one or more computing platforms). For example, a computer readable medium may include any suitable form of volatile or non-volatile memory. In some embodiments, the computer readable media may include a non-transitory computer readable medium.

While the foregoing is directed to embodiments of the present principles, other and further embodiments of the principles may be devised without departing from the basic scope thereof.

The invention claimed is:

1. A method comprising:
 implanting a substrate to create an ion implanted layer; and
 annealing the ion implanted layer comprising contacting a top surface of the substrate with a plasma at a pressure from about 300 Torr to about 1000 Torr for a period of time sufficient to heat a first portion of the substrate comprising the ion implanted layer to a maximum temperature of less than or equal to about 950° C., wherein the first portion of the substrate has a depth of less than about 200 nm determined from the top surface,
 wherein a second portion of the substrate, having a depth of greater than or equal to about 200 nm is heated to a maximum temperature of less than about 450° C.

2. The method of claim 1, wherein the pressure is from about 700 Torr to about 800 Torr.

3. The method of claim 1, wherein the first portion of the substrate comprises an ion implanted silicon on insulator layer and wherein the second portion of the substrate comprised at least one annealed ion implanted silicon layer.

4. The method of claim 3, wherein the second portion of the substrate comprises an annealed ion implanted silicon on insulator layer disposed below the first portion of the substrate.

5. The method of claim 1, wherein the contacting the top surface of the substrate with the plasma comprises contacting a portion of the top surface of the substrate with the plasma while moving the substrate, a plasma source, or both.

6. The method of claim 1, wherein the contacting the top surface of the substrate with the plasma comprises contacting essentially all of the top surface of the substrate with the plasma at the same time.

7. The method of claim 1, wherein the maximum temperature is from about 850° C. to about 950° C.

8. The method of claim 1, wherein the plasma is generated using an Rf energy at a power of less than or equal to about 1000 watts;

wherein the plasma is at a bombardment energy of less than or equal to about 5 eV;

wherein the plasma comprises helium, neon, and/or argon; or a combination thereof.

9. The method of claim 1, wherein the plasma is formed via dielectric barrier discharge.

\* \* \* \* \*